(12) United States Patent
Morita

(10) Patent No.: US 8,483,870 B2
(45) Date of Patent: Jul. 9, 2013

(54) SUBSTRATE PROCESSING APPARATUS AND METHOD OF DISPLAYING ABNORMAL STATE OF SUBSTRATE PROCESSING APPARATUS

(75) Inventor: Osamu Morita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 671 days.

(21) Appl. No.: 12/704,910

(22) Filed: Feb. 12, 2010

(65) Prior Publication Data
US 2010/0211216 A1   Aug. 19, 2010

(30) Foreign Application Priority Data

Feb. 13, 2009  (JP) .................................. 2009-031613
Jan. 8, 2010  (JP) .................................. 2010-003088

(51) Int. Cl.
*G06F 7/00*  (2006.01)

(52) U.S. Cl.
USPC .......................................... 700/228; 700/121

(58) Field of Classification Search
USPC .................................. 700/228, 214, 121, 112
See application file for complete search history.

(56) References Cited

U.S. PATENT DOCUMENTS

| 7,162,320 B2 * | 1/2007 | Derson et al. ................. 700/112 |
| 2004/0022023 A1 * | 2/2004 | Kimura et al. ................ 361/685 |
| 2004/0254675 A1 * | 12/2004 | Derson et al. ................. 700/213 |
| 2007/0126720 A1 * | 6/2007 | Yamamoto et al. ........... 345/204 |

FOREIGN PATENT DOCUMENTS

| CN | 1967271 | 5/2007 |
| JP | 2005 071086 | 3/2005 |
| JP | 2005-71086 | 3/2005 |
| JP | 2006-227716 | 8/2006 |
| JP | 2006 310349 | 11/2006 |
| KR | 102007 0053130 | 5/2007 |

* cited by examiner

*Primary Examiner* — Ramya Burgess
(74) *Attorney, Agent, or Firm* — Brundidge & Stanger, P.C.

(57) ABSTRACT

Provided are a substrate processing apparatus and a method of displaying an abnormal state of the substrate processing apparatus. The substrate processing apparatus including: a manipulation unit including a manipulation screen displaying a state of at least one of a substrate carrying mechanism and a substrate processing mechanism; and a control unit including a carrying system controller controlling the substrate carrying mechanism. The manipulation unit comprises a setting screen through which detection conditions of sensors configured to detect states of the substrate carrying mechanism and the substrate processing mechanism, and information about a torque limitation including the enabling or disabling of the torque control and a torque control value are set for the substrate carrying mechanism. The carrying system controller assigns a motion of the substrate carrying mechanism to a carrying control module based on an instruction from the manipulation unit, and the carrying control module controls the substrate carrying mechanism according to the instruction and the information.

9 Claims, 8 Drawing Sheets

Fig. 8A

| No | SETTING ITEM | SETTING VALUE |
|---|---|---|
| 1 | DRIVER KIND | 0 |
| 2 | TORQUE CONTROL FUNCTION | 3 |
| 3 | VIBRATION SENSOR DETECTION FUNCTION | 0 |
| 4 | REPORT MONITOR KIND 1 | 6 |
| 5 | REPORT MONITOR KIND 2 | 5 |
| 6 | REPORT MONITOR KIND 3 | 7 |
| 7 | REPORT MONITOR KIND 4 | 2 |
| 8 | REPORT MONITOR KIND 5 | 8 |
| 9 | REPORT MONITOR KIND 6 | 12 |
| 10 | | 0 |
| 11 | | 0 |
| 12 | | 0 |
| 13 | | 0 |
| 14 | | 0 |
| 15 | | 0 |
| 16 | | 0 |
| 17 | | 0 |
| 18 | | 0 |
| 19 | | 0 |
| 20 | | 0 |

Fig. 8B

| No | SETTING ITEM | SETTING VALUE |
|---|---|---|
| 141 | FORWARD TORQUE LIMIT VALUE | 100 |
| 142 | BACKWARD TORQUE LIMIT VALUE | 100 |
| 143 | ZERO VELOCITY DETECTION WIDTH | 20 |
| 144 | VELOCITY EQUAL SIGNAL DETECTION WIDTH | 10 |
| 145 | I/O BIT DEFINITION / DISABLED (SVCMD_CTRL) | 0 |
| 146 | I/O BIT DEFINITION / DISABLED (SVCMD_STAT) | 0 |
| 147 | I/O BIT DEFINITION / DISABLED (OUTPUT VALUE) | 0 |
| 148 | I/O BIT DEFINITION / DISABLED (INPUT VALUE) | 0 |
| 149 | | 0 |
| 150 | | 0 |
| 151 | | 0 |
| 152 | | 0 |
| 153 | | 0 |
| 154 | | 0 |
| 155 | | 0 |
| 156 | | 0 |
| 157 | | 0 |
| 158 | | 0 |
| 159 | | 0 |
| 160 | | 0 |

SUBSTRATE PROCESSING APPARATUS AND METHOD OF DISPLAYING ABNORMAL STATE OF SUBSTRATE PROCESSING APPARATUS

CROSS-REFERENCE TO RELATED PATENT APPLICATION

This U.S. non-provisional patent application claims priority under 35 U.S.C. §16 of Japanese Patent Applications No. 2009-031613 filed on Feb. 13, 2009, and No 2010-003088 filed on Jan. 8, 2010, in the Japanese Patent Office, the entire contents of which are hereby incorporated by reference.

BACKGROUND OF THE INVENTION

1. Field of the Invention

The present invention relates to a substrate processing apparatus configured to perform a process such as a thin film forming process, an oxidation process, an impurity diffusing process, an annealing process, and an etching process on a substrate such as a semiconductor substrate, and more particularly, to a substrate processing apparatus capable of controlling a substrate processing motion and a method of displaying an abnormal state of the substrate processing apparatus.

2. Description of the Prior Art

A substrate processing apparatus includes a motion (operation) control unit configured to control a carrying mechanism used to carry a substrate for performing a substrate processing. The motion control unit sends a motion instruction to an actuator for motion control, and the actuator is operated according to the motion instruction within its rated torque range for preventing a failure. However, operation within a rated torque range does not always guarantee safety of all carrying mechanisms of the substrate processing apparatus.

Each carrying mechanism has a preset safe torque range, and the carrying mechanism can be stably controlled by using the safe torque range. That is, when a material is transported, the material can be less vibrated.

However, if vibration is excessively suppressed, carrying speed and throughput are decreased. On the other hand, if carrying speed is largely increased, the carrying mechanism may be stopped due to the operation of a collision detection sensor (e.g., a vibration sensor) installed at the carrying mechanism.

In a conventional substrate processing apparatus, it is unclear whether a halt is caused by torque limitation or a vibration sensor, and thus a proper alarm cannot be generated according to the reason of the halt.

Furthermore, in a conventional substrate processing apparatus, by using a torque limitation function of an actuator used for motion control, torque control is possible. However, if once the torque limitation function is set, since a torque control operation is performed on any motion, unnecessary stopping may occur due to the torque control operation.

In the conventional art, an adjustment tool for registering torque limitation values is additionally prepared, and each actuator is accessed to adjust an interface between the actuator and a carrying mechanism. However, such adjustment is not easy because the adjustment tool has to be transported to a customer's clean room to adjust the carrying mechanism and the interface.

SUMMARY OF THE INVENTION

An object of the present invention is to provide: a motion controllable substrate processing apparatus capable of setting safe range of torque limitation values and enabling or disabling torque limitation functions with respect to actuators configured to actuate carrying mechanisms, and capable of displaying a proper alarm if an actuator is stopped; and a method of displaying an abnormal state of the substrate processing apparatus.

According to an aspect of the present invention, there is provided a substrate processing apparatus including: a manipulation unit including a manipulation screen configured to display at least a state of a substrate carrying mechanism configured to carry a substrate, and a setting screen through which information about a torque limitation including enabling or disabling of torque control and a torque limit value is set for the substrate carrying mechanism; and a control unit including a carrying system controller configured to assign an operation of the substrate carrying mechanism to a carrying control module based on an instruction received from the manipulation unit, wherein the manipulation unit controls the manipulation screen to display a detection result of one or more state detection sensors configured to detect the state of the substrate carrying mechanism when the substrate carrying mechanism is stopped due to an abnormal state occurring while the substrate is carried by the substrate carrying mechanism according to control of the control unit based on the instruction received from the manipulation unit and the information about the torque limitation.

According to another aspect of the present invention, there is provided a method of displaying an abnormal state of a substrate processing apparatus according to the above aspect, the method including: detecting an abnormal state by using state detection sensors configured to detect a state of a substrate carrying mechanism; reporting information about a stop reason of the substrate carrying mechanism including a detection result of the state detection sensors to a manipulation unit when an abnormal state occurs; and controlling a manipulation screen to display a signal representing the stop reason included in the information about the stop reason.

BRIEF DESCRIPTION OF THE DRAWINGS

FIG. 8A and FIG. 8B illustrate setting screens of torque control according to the present invention, in which FIG. 8A illustrates a screen for selecting enabling or disabling torque control and FIG. 8B illustrates a screen for setting torque limitation values.

DETAILED DESCRIPTION OF THE PREFERRED EMBODIMENTS

Embodiments of the present invention will be described hereinafter with reference to the attached drawings.

First, with reference to FIG. 1 and FIG. 2, a substrate processing apparatus will be described according to the present invention.

Figure 1:
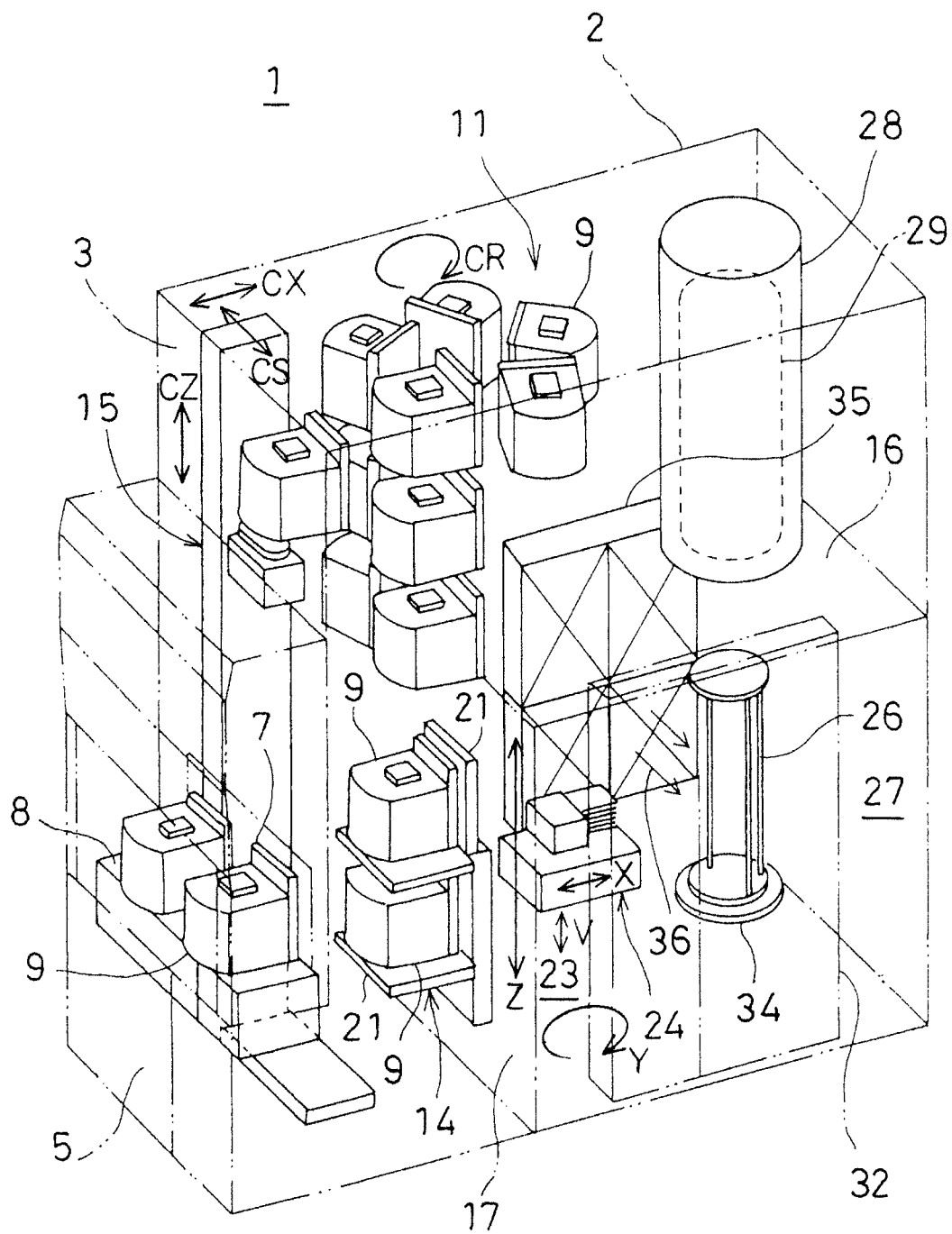
FIG. 1 is a perspective view illustrating a substrate processing apparatus according to the present invention.
Figure 2:
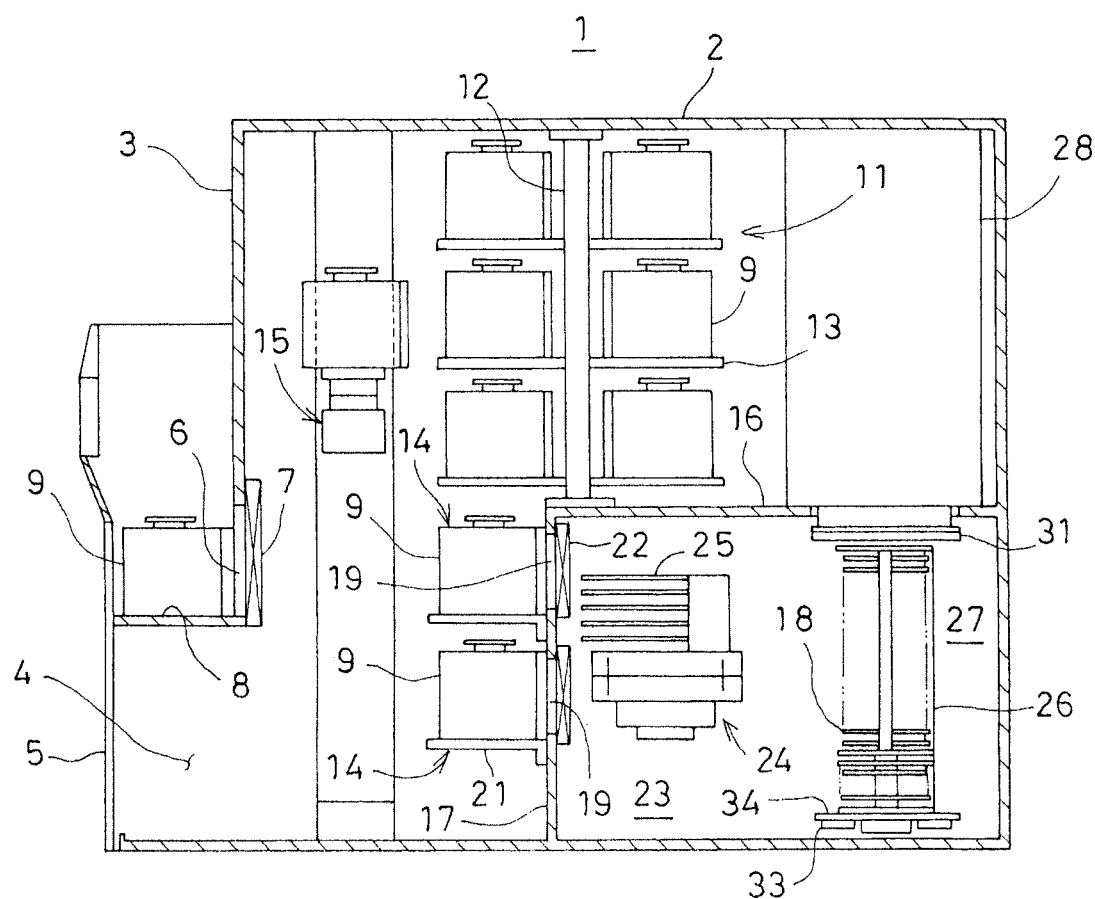
FIG. 2 is a side sectional view illustrating the substrate processing apparatus according to the present invention.

FIG. 1 and FIG. 2 illustrate a vertical type substrate processing apparatus as an example of a substrate processing apparatus. In addition, wafers made of silicon are illustrated as examples of substrates to be processed by the substrate processing apparatus.

A substrate processing apparatus 1 includes a case 2, and in a front wall 3 of the case 2, a front maintenance entrance 4 is formed as an opening for maintenance works. The front maintenance entrance 4 is configured to be opened and closed by a front maintenance door 5.

At the front wall 3 of the case 2, a pod carrying entrance 6 is formed to connect the outside and inside of the front wall 3, and the pod carrying entrance 6 is configured to be opened and closed by a front shutter (carrying entrance opening/closing mechanism) 7. At the front side of the pod carrying entrance 6, a load port (substrate carrying container stage) 8 is installed, and the load port 8 is configured such that pods 9 can be placed on the load port 8 in a position aligned state.

The pods 9 are airtight substrate carrying containers configured to be carried onto and away from the load port 8 by an in-process carrying device (not shown).

Near the upper center part of the inside of the case 1 in a front-to-back direction, a rotatable pod shelf (substrate container shelf) 11 is installed in a manner such that the rotatable pod shelf 11 can be rotated in a CR-axis direction. A plurality of pods 9 can be stored on the rotatable pod shelf 11.

The rotatable pod shelf 11 includes a pillar 12 which is vertically installed and intermittently rotatable, and a plurality of shelf plates (substrate container shelves) 13 which is radially supported at upper, middle, and lower positions of the pillar 12. A plurality of pods 9 can be placed and stored on each of the shelf plates 13.

At the lower side of the rotatable pod shelf 11, pod openers (substrate carrying container opening/closing mechanisms) 14 are installed, which are configured to receive pods 9 and open/close caps of the pods 9.

Among the load port 8, the rotatable pod shelf 11, and the pod openers 14, a pod carrying device (container carrying device) 15 is installed. The pod carrying device 15 is configured to hold a pod 9, lift/lower the pod 9 in a CZ-axis direction, move the pod 9 forward and backward in a CX-axis direction, and move the pod 9 transversely in a CS-axis direction, so as to carry the pod 9 among the load port 8, the rotatable pod shelf 11, and the pod openers 14.

At the lower center part of the inside of the case 1 in a front-to-back direction, a sub case 16 is installed in a manner such that the sub case 16 extends to the rear part of the case 1. In order to carry wafers (substrates) 18 into and out of the sub case 16, a pair of wafer carrying entrances (substrate carrying entrances) 19 are formed at a front wall 17 of the sub case 16 in a manner such that the wafer carrying entrances 19 are vertically arranged in two stages. At the upper and lower wafer carrying entrances 19, the pod openers 14 are installed, respectively.

Each of the pod openers 14 includes a stage 21 configured to receive a pod 9 and a cap attachment/detachment mechanism 22 configured to attach and detach a cap of the pod 9. Each of the pod opener 14 is configured to attach and detach a cap of a pod 9 placed on the stage 21 by using the cap attachment/detachment mechanism 22 for closing and opening a wafer carrying entrance of the pod 9.

The sub case 16 forms a transfer chamber 23 which is hermetically isolated from a space (pod carrying space) where the pod carrying device 15 and the rotatable pod shelf 11 are installed. At the front region of the transfer chamber 23, a wafer carrying mechanism (substrate carrying mechanism) 24 is installed, which includes a predetermined number of wafer placement plates 25 (five in the drawing) to place wafers 18 thereon. The wafer placement plates 25 are configured to move straightly in a horizontal direction (X-axis), rotate on a horizontal plane (Y-axis), and ascend/descend (in a Z-axis direction). The wafer carrying mechanism 24 is configured to charge wafers 18 into a boat (substrate holder) 26 and discharge the wafers 18 from the boat 26.

Four parameters, X, Y, Z, and V axes, are set for the wafer carrying mechanism 24 so that when the wafer placement plates 25 take wafers 18 out of and into a predetermined place, an approaching motion of the wafer placement plates 25 is controlled along the X-axis, an approaching angle of the wafer placement plates 25 is controlled along the Y-axis when the wafer placement plates 25 place wafers 18 into the boat 26, an approaching height of the wafer placement plates 25 is controlled along the Z-axis when the wafer placement plates 25 place the wafers 18 into the boat 26, and an insertion gap of the wafers 18 is controlled along the V-axis (fine version of the Z-axis).

In the rear region of the transfer chamber 23, a standby section 27 is formed to accommodate the boat 26 and keep the boat 26 in a standby state, and at the upper side of the standby section 27, a vertical type process furnace 28 is installed. In the process furnace 28, a process chamber 29 is formed, and the lower part of the process chamber 29 forms a furnace port part which is configured to be opened and closed by a furnace port shutter (furnace port opening/closing mechanism) 31.

Between the right end part of the case 2 and the right end part of the sub case 16, a boat elevator (substrate holder elevating mechanisms) 32 is installed to lift and lower the boat 26. A an arm 33 is connected to an elevator base of the boat elevator 32, and a seal cap 34 is horizontally attached to the arm 33 to support the boat 26 vertically and hermetically close the furnace port part of the process chamber 29 in a state where the boat 26 is loaded in the process chamber 29.

The boat 26 is configured to hold a plurality of wafers 18 (for example, fifty to one hundred twenty five wafers) in a state where the wafers 18 are horizontally positioned and arranged in multiple stages with their centers being aligned.

At a side opposite to the boat elevator 32, a cleaning unit 35 is installed, which is configured by a supply fan and a dust filter to supply a cleaned atmosphere or inert gas as clean air 36. Between the wafer carrying mechanism 24 and the cleaning unit 35, a notch alignment device (not shown) is installed as a substrate matching device for aligning the circumferences of wafers 18.

Clean air 36 blown from the cleaning unit 35 is distributed around the notch alignment device (not shown), the wafer carrying mechanism 24, and the boat 26. Then, the air 36 is sucked through a duct (not shown) to the outside of the case 2, or the air 36 is blown back to the transfer chamber 23 by the cleaning unit 134.

Next, an operation of the substrate processing apparatus 1 will be described.

When a pod 9 is supplied to the load port 8, the pod carrying entrance 6 is opened by moving the front shutter 7. The pod 9 is introduced from the load port 8 into the case 2 through the pod carrying entrance 6 by the pod carrying device 15, and then the pod 9 is placed on a predetermined one of the shelf plates 13 of the rotatable pod shelf 11. After the pod 9 is temporarily stored on the rotatable pod shelf 11, the pod 9 is carried by the pod carrying device 15 from the shelf plate 13 to the stage 21 of one of the pod openers 14. Alternatively, the pod 9 may be directly carried from the load port 8 to the stage 21.

At this time, the lower wafer carrying entrance 19 is closed by the cap attachment/detachment mechanism 22, and clean air 36 is distributed and filled in the transfer chamber 23. For example, nitrogen is filled in the transfer chamber 23 as clean air 36 to keep the oxygen concentration of the inside of the transfer chamber 23 at 20 ppm or lower which is much lower than the oxygen concentration of the inside (ambient atmosphere) of the case 2.

When the pod 9 is placed on the stage 21, the opening-side of the pod 9 is pressed by the edge of the wafer carrying entrance 19 of the front wall 17 of the sub case 16, and along with this, the cap of the pod 9 is detached by the cap attachment/detachment mechanism 22, so that the wafer carrying entrance of the pod 9 can be opened.

After the pod 9 is opened by the pod opener 14, the wafer carrying mechanism 24 picks up wafers 18 from the pod 9 and carries the wafers 18 to the notch alignment device (not shown), and after the notch alignment device aligns the wafers 18, the wafer carrying mechanism 24 carries the wafers 18 to the standby section 27 located at the rear side of the transfer chamber 23 to charge the wafers 18 into the boat 26 (wafer charging).

After the wafer carrying mechanism 24 transfers the wafers 18 to the boat 26, the wafer carrying mechanism 24 goes back to the pod 9 so as to charge the next wafers 18 to the boat 26.

While wafers 18 are charged into the boat 26 from the side of one (upper or lower one) of the pod openers 14 by the wafer carrying mechanism 24, another pod 9 is concurrently carried to and placed on the other (lower or upper one) of the pod openers 14 from the rotatable pod shelf 11 by the pod carrying device 15, and the other pod opener 14 opens the other pod 9.

After a predetermined number of wafers 18 are charged into the boat 26, the furnace port part of the process furnace 28 closed by the furnace port shutter 31 is opened by moving the furnace port shutter 31. Then, the boat 26 is lifted and loaded into the process chamber 29 (boat loading) by the boat elevator 32.

After the boat 26 loading, the furnace port part is hermetically closed by the seal cap 34.

The process chamber 29 is evacuated to a predetermined pressure (vacuum degree) by a gas exhaust device (not shown). In addition, the process chamber 29 is heated by a heater driving unit (not shown) to obtain desired temperature distribution inside the process chamber 29.

In addition, a gas supply mechanism (not shown) supplies a process gas to the process chamber 29 at a predetermined flowrate, and while the process gas flows through the process chamber 29, the process gas makes contact with the surfaces of the wafers 18 so that thin films can be formed on the surfaces of the wafers 18 by thermal chemical vapor deposition (CVD). After the reaction, the process gas is exhausted from the process chamber 29 by the gas exhaust device.

After a predetermined time, the gas supply mechanism supplied inert gas from an inert gas supply source (not shown) to replace the inside atmosphere of the process chamber 29 with the inert gas, and along with this, the pressure of the process chamber 29 returns to atmospheric pressure.

The boat elevator 32 lowers the boat 26 placed on the seal cap 34.

The processed wafers 18 and the pod 9 are discharged to the outside of the case 2 in a reverse order to the above-described order. Then, non-processed wafers 18 are charged into the boat 26 to repeat the batch processing process on the non-processed wafers 18.

Figure 3:
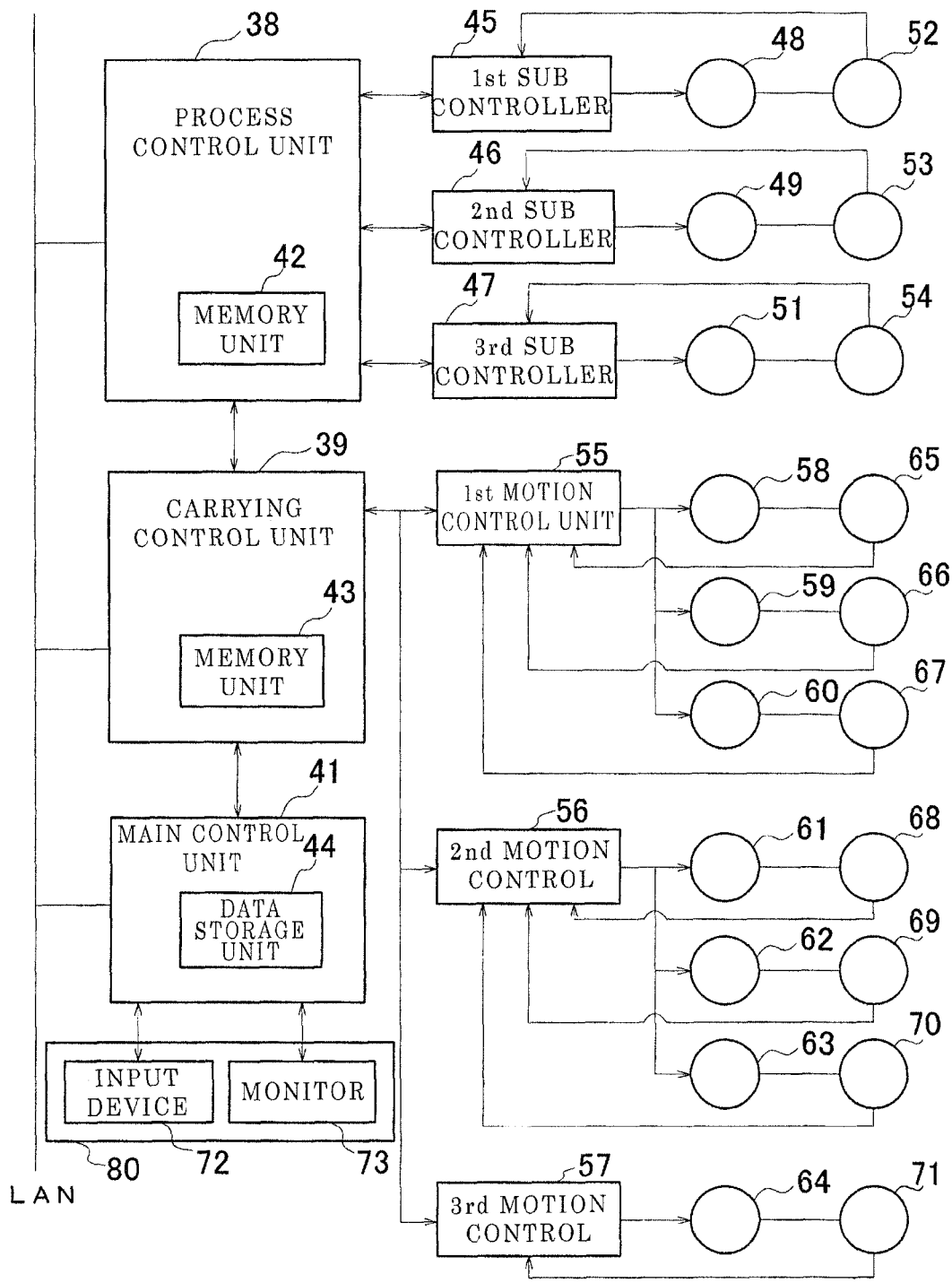
FIG. 3 is a block diagram illustrating a control system of the substrate processing apparatus according to the present invention.

With reference to FIG. 3, an explanation will be given on a control device 37 that controls the carrying mechanism configured to carry a pod 9 accommodating a plurality of wafers 18 among the load port 8, the rotatable pod shelf 11, and the pod openers 14; the carrying mechanisms configured to carry the wafers 18 from the pod 9 to the boat 26 or carry the boat 26 to the process furnace 28, the gas supply mechanism configured to supply a process gas to the process furnace 28; the gas exhaust mechanism configured to exhaust the process furnace 28; and the heater driving unit configured to heat the process furnace 28 to a predetermined temperature. In addition, the control device 37 is configured to individually control the carrying mechanisms, the gas supply mechanism, the gas exhaust mechanism, and the heater driving unit. Furthermore, the gas supply mechanism, the gas exhaust mechanism, the process furnace 28, and the heater driving unit constitute a substrate processing mechanism.

In FIG. 3, reference numeral 38 denotes a process control unit which is a process system controller, and reference numeral 39 denotes a carrying control unit which is a carrying system controller, and reference numeral 41 denotes a main control unit. The process control unit 38 includes a memory unit 42, and the memory unit 42 stores a process execution program for executing a process. The carrying control unit 39 includes a memory unit 43, and the memory unit 43 stores a carrying program for executing a wafer carrying process and a motion control program for controlling motions of three carrying mechanisms: the pod carrying device 15, the wafer carrying mechanism 24, and the boat elevator 32. The main control unit 41 includes a data storage unit 44 which is configured by, for example, an external storage device such as a hard disk drive (HDD). Alternatively, the process execution program, the carrying program, and the motion control program may be stored in the data storage unit 44.

In addition, reference numerals 45, 46, and 47 are exemplary sub controllers. For example, reference numeral 45 denotes a first sub controller configured to control heating of the process furnace 28; reference numeral 46 denotes a second sub controller configured to control the supply flowrate of a process gas to the process furnace 28 by controlling opening/closing of a value and operation of a flowrate control device; reference numeral 47 denotes a third sub controller configured to control gas exhaustion from the process furnace 28 or the pressure of the process furnace 28. In addition, reference numerals 48, 49, and 51 denote exemplary actuators. For example, reference numeral 48 denotes a heater (hereinafter referred to as a first process actuator) configured to be controlled by the first sub controller 45; reference numeral 49 denotes a flow control device (hereinafter referred to as a second process actuator) configured to be controlled by the second sub controller 46; and reference numeral 51 denotes a pressure control valve (hereinafter referred to as a third process actuator) configured to be controlled by the third sub controller 47. In addition, although only one process actuator is shown for each type in the drawing, a plurality of process actuators may be provided for each type.

In addition, reference numerals 52, 53, and 54 denote exemplary feedback sensors configured to detect states of the actuators and feed the detection results back to the first sub controller 45, the second sub controller 46, and the third sub controller 47. For example, reference numeral 52 denotes a temperature detector (hereinafter referred to as a first process sensor); reference numeral 53 denotes a flowrate detector (hereinafter referred to as a second process sensor); and reference numeral 54 denotes a pressure sensor (hereinafter referred to as a third process sensor). In addition, although only one detector or sensor is provided for one actuator in the drawing, a plurality of detectors or sensors may be provided for one actuator. Furthermore, both a detector and a sensor may be provided for each actuator.

In addition, the carrying control unit 39 is configured to control carrying control modules, and the carrying control modules are configured by a first motion control unit 55, a second motion control unit 56, and a third motion control unit 57 that are used to control actuators (described later).

In addition, reference numeral 58 denotes a motor (hereinafter referred to as a first motion actuator) configured to actuate the pod carrying device 15 in the CX-axis direction; reference numeral 59 denotes a motor (hereinafter referred to as a first motion actuator) configured to actuate the pod carrying device 15 in the CZ-axis direction; and reference numeral 60 denotes a motor (hereinafter referred to as a first motion actuator) configured to actuate the pod carrying device 15 in the CS-axis direction. In addition, reference numeral 61 denotes a motor (hereinafter referred to as a second motion actuator) configured to actuate the wafer carrying mechanism 24 in the X-axis direction; reference numeral 62 denotes a motor (hereinafter referred to as a second motion actuator) configured to actuate the wafer carrying mechanism 24 in the Y-axis direction; reference numeral 63 denotes a motor (hereinafter referred to as a second motion actuator) configured to actuate the wafer carrying mechanism 24 in the Z-axis direction; and reference numeral 64 denotes a motor (hereinafter referred to as a third motion actuator) configured to actuate the boat elevator 32.

In addition, at the respective motion actuators, state detection sensors 65, 66, 67, 68, 69, 70, and 71 are installed as sensors for detecting states of the motion actuators such as whether the motion actuator reaches a vibration or velocity limit, and states of the respective axes. In addition, the state detection sensors 65, 66, 67, 68, 69, 70, and 71 are configured to detect states of the respective motion actuators and feed back the detection results to the first motion control unit 55, the second motion control unit 56, and the third motion control unit 57. The first motion control unit 55, the second motion control unit 56, and the third motion control unit 57 include memories and can temporarily store feedback data (detection results). Although FIG. 3 illustrates the case where the state detection sensors 65, 66, 67, 68, 69, 70, and 71 are installed at the motion actuators 58, 59, 60, 61, 62, 63, and 64, respectively, the present invention is not limited thereto. For example, a plurality of state detection sensors may be installed at each of the state detection sensors 65, 66, 67, 68, 69, 70, and 71.

The first motion control unit 55 is configured to control an operation of the pod carrying device 15 so as to transfer a pod 9 from the load port 8 to the stage 21; the second motion control unit 56 is configured to control an operation of the wafer carrying mechanism 24 so as to pick up wafers 18 from the pod 9 and charge the wafers 18 into the boat 26; and the third motion control unit 57 is configured to control an operation of the boat elevator 32 so as to load the boat 26 charged with the wafers 18 into the process furnace 28.

In addition, reference numeral 72 denotes an input device such as a keyboard, a mouse, or a manipulation panel; reference numeral 73 denotes a monitor providing a manipulation screen; and reference numeral 80 denotes a manipulation unit through which various instructions are input by using the monitor 73 and the input device 72.

The process control unit 38 inputs instructions of setting values or command signals according to the process sequence to the first sub controller 45, the second sub controller 46, and the third sub controller 47; and based on detection results of the first process sensor 52, the second process sensor 53, and the third process sensor 54, the process control unit 38 controls overall operations of the first sub controller 45, the second sub controller 46, and the third sub controller 47.

In addition, the process control unit 38 performs a substrate process in response to a command input from the manipulation unit 80 through the main control unit 41. The process control unit 38 performs the substrate process using the program stored in the memory unit 42 independent of other control systems. Therefore, even when the carrying control unit 39 or the main control unit 41 malfunctions, the substrate process is completed without failure.

Whether to perform torque control is previously set for each of the motion actuators 58, 59, 60, 61, 62, 63, and 64. In addition, parameters such as target positions, velocities, accelerations, decelerations, and torque limitation values are input to the motion actuators 58, 59, 60, 61, 62, 63, and 64 from the manipulation unit 80 through the carrying control unit 39, or command signals are input to the main control unit 41 in accordance with a process sequence.

The first motion control unit 55 controls the motion actuators 58, 59, and 60 based on detection results of the state detection sensors 65, 66, and 67. In addition, the second motion control unit 56 controls the motion actuators 61, 62, and 63 based on detection results of the state detection sensors 68, 69, and 70. In addition, the third motion control unit 57 controls the motion actuator 64 based on a detection result of the state detection sensors 71. In this way, the motion control units respectively control the motion actuators corresponding to the state detection sensors.

In addition, the carrying control unit 39 performs a carrying process according to instructions input from the manipulation unit 80, and pods 9 or wafers 18 are carried independent of other control systems according to the carrying program or the motion control program stored in the memory unit 43 of the carrying control unit 39. Therefore, even when the process control unit 38 or the main control unit 41 malfunctions, wafers 18 can be completely carried without failure.

The data storage unit 44 stores various programs as files, such as a program for overall control of a substrate process, a setup program for setting processing details and conditions, a substrate processing recipe containing setting information about heating of the process furnace 28 or supply and exhaustion of process gas to and from the process furnace 28, a communication program, an alarm information display program, and a parameter editor program.

The communication program is provided for transmitting and receiving data to and from the process control unit 38 and the carrying control unit 39 through a communication medium such as a local area network (LAN). In addition, the alarm information display program is provided for making the monitor 73 display alarm information about a reason of an abnormal state of the motion actuators 58, 59, 60, 61, 62, 63, and 64 such as a reason of stopping when the state detection sensors 65, 66, 67, 68, 69, 70, and 71 detect a abnormal state; and the parameter editor program is provided for editing parameters necessary for controlling operations of the motion actuators 58, 59, 60, 61, 62, 63, and 64 or setting stop conditions such as torque limitation values for the carrying mechanisms.

The data storage unit 44 has a data storage region for storing parameters necessary for carrying wafers 18, and periodically storing information such as setting information previously set for the carrying mechanisms, detection results of the state detection sensors 65, 66, 67, 68, 69, 70, and 71, and processing states. The storing period is previously set according to data processing loads of the carrying control unit 39 and the process control unit 38.

Generally, the storing period is set to be longer than detecting periods of the state detection sensors 65, 66, 67, 68, 69, 70, and 71.

Information about enabling/disabling of torque control of the motion actuators 58, 59, 60, 62, 61, 63, and 64 is previously stored in the motion actuators 58, 59, 60, 61, 62, 63, and 64 as setting information.

When it is intended to carry wafers 18, in addition to the information about enabling/disabling of torque control, setting values such as target positions, velocities, accelerations, decelerations, torque control execution directions, and torque limitation values for torque control are input through the manipulation unit 80. Then, if a carrying process execution command is input, the carrying program stored in the memory unit 43 is executed, and the motion control program is executed according to an instruction from the carrying program.

When the carrying program is executed, the carrying control unit 39 controls the pod carrying device 15, the wafer carrying mechanism 24, and the boat elevator 32 through the first motion control unit 55, the second motion control unit 56, and the third motion control unit 57.

If torque control previously set in the motion actuators 58, 59, 60, 61, 62, 63, and 64 is preformed, a setting value input through the manipulation unit 80 is put as a limitation value, and if a detection value greater than the limitation value is output from at least one of the state detection sensors 65, 66, 67, 68, 69, 70, and 71 installed at the motion actuators 58, 59, 60, 61, 62, 63, and 64, one or more of the motion actuators 58, 59, 60, 61, 62, 63, and 64 which actuate a corresponding carrying mechanism are stopped.

If at least one of the motion actuators 58, 59, 60, 61, 62, 63, and 64 is stopped, a reason of stopping of the motion actuator (the detection result of the state detection sensor) is reported as an alarm signal to the main control unit 41. In response to the alarm signal, the alarm information display program is executed, and the monitor 73 displays alarm information. At this time, the alarm information includes at least one alarm signal.

Furthermore, in response to the alarm signal transmitted to the main control unit 41 to report stopping of if at least one of the motion actuators 58, 59, 60, 61, 62, 63, and 64, a carrying operation stop command is input to the carrying control unit 39, and the other motion actuators are stopped to interrupt the carrying operation of wafers 18.

Figure 4A:
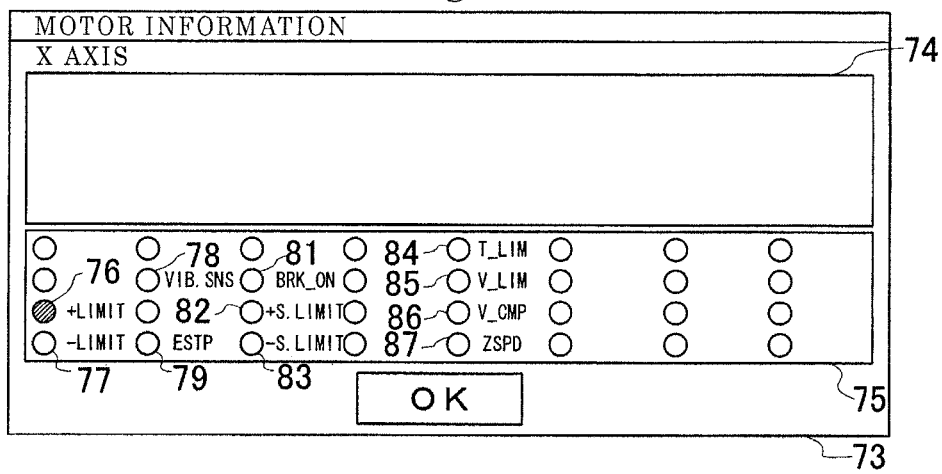
FIG. 4A to FIG. 4C are schematic views illustrating alarm examples according to the present invention.
Figure 4B:
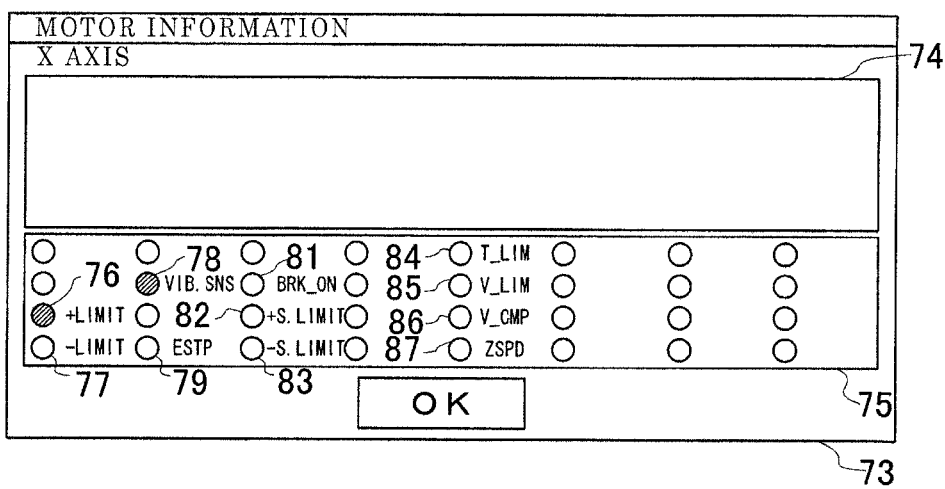
Figure 4C:
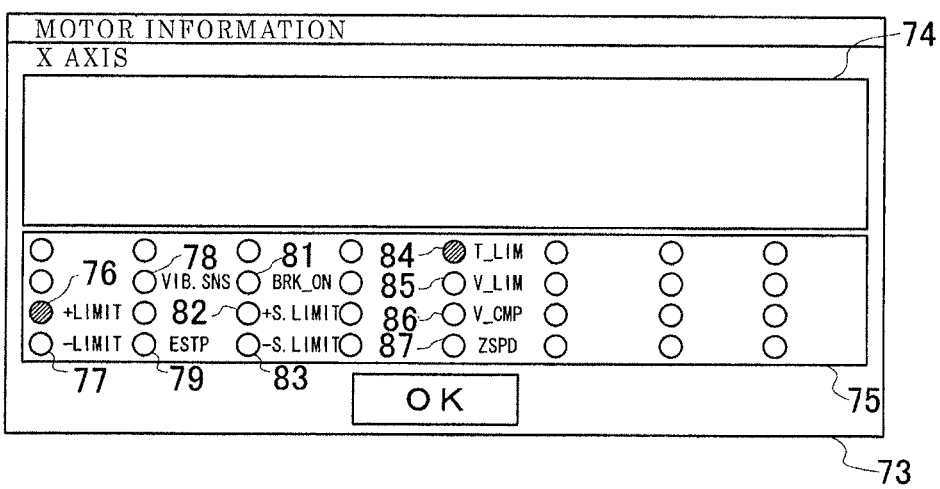

FIG. 4A to FIG. 4C illustrate examples of alarm information displayed on the monitor 73. In the example, parameters (setting values) of the second motion actuator 61 and a stop reason detected by the state detection sensor 68 are displayed on the monitor 73.

In FIG. 4A to 4C, reference numeral 74 denotes a parameter display window, and reference numeral 75 denotes an alarm information display window.

When the state detection sensor 68 detects an abnormal state and the second motion actuator 61 is stopped, the stopping reason detected by the state detection sensor 68 is output as an alarm signal, and when the main control unit 41 receives the alarm signal through the carrying control unit 39, the alarm information display program is executed.

For example, in the alarm information display window 75, eleven stopping reasons items are displayed, and one or more of the eleven stopping reason items may be turned on according to the stopping reason detected by the state detection sensor 68.

Reference numeral 76 denotes a plus limit signal +LIMIT indicating whether the wafer placement plates 25 are at a limit position in the X-axis direction with reference to the boat 26.

Reference numeral 77 denotes a minus limit signal −LIMIT indicating whether the wafer placement plates 25 are at a limit position in the X-axis direction with reference to a pod 9.

Reference numeral 78 denotes a vibration sensor signal VIB. SNS indicating whether a vibration is detected by a vibration sensor, and reference numeral 79 denotes an emergency stop signal ESTP indicating whether an emergency stop signal is input.

Reference numeral 81 denotes a brake operation signal BRK_ON indicating whether a brake is operated or not.

Reference numeral 82 denotes a plus soft limit signal +S. LIMIT indicating whether a logical position set close to a plus limit is occupied.

Reference numeral 83 denotes a minus soft limit signal −S. LIMIT indicating whether a logical position set close to a minus limit is occupied.

Reference numeral 84 denotes a torque limit operation signal T_LIMIT indicating whether an operation is carried out within torque limit values input through the manipulation unit 80.

Reference numeral 85 denotes a velocity limit operation signal V_LIMIT indicating whether an operation is carried out within velocity limits input through the manipulation unit 80.

Reference numeral 86 denotes a velocity consistent signal V_COMP indicating whether a set velocity input through the manipulation unit 80 is followed.

In addition, reference numeral 87 denotes a zero velocity detection signal ZSPD indicating a zero velocity detection state.

Referring to FIG. 4A, in the alarm information display window 75, only the +LIMIT 76 is turned on, which indicates a stop caused by an overrun of the wafer placement plates 25 in the direction of the boat 26.

Referring to FIG. 4B, in the alarm information display window 75, the +LIMIT 76 and the VIB. SNS 78 are turned on, which indicates a stop caused by a vibration detected by the vibration sensor in the case where wafers 18 are carried too much rapidly or the wafer placement plates 25 collide with something.

Referring to FIG. 4C, in the alarm information display window 75, the +LIMIT 76 and the T_LIMIT 84 are turned on, which indicates a stop caused by an operation of the wafer carrying mechanism 24 out of the torque limitation values input through the manipulation unit 80.

The +LIMIT 76 is turned on all in the cases of FIGS. 4B and 4C so as to stop the wafer carrying mechanism 24 most rapidly when the state detection sensor 68 detects an abnormal state.

Figure 5:
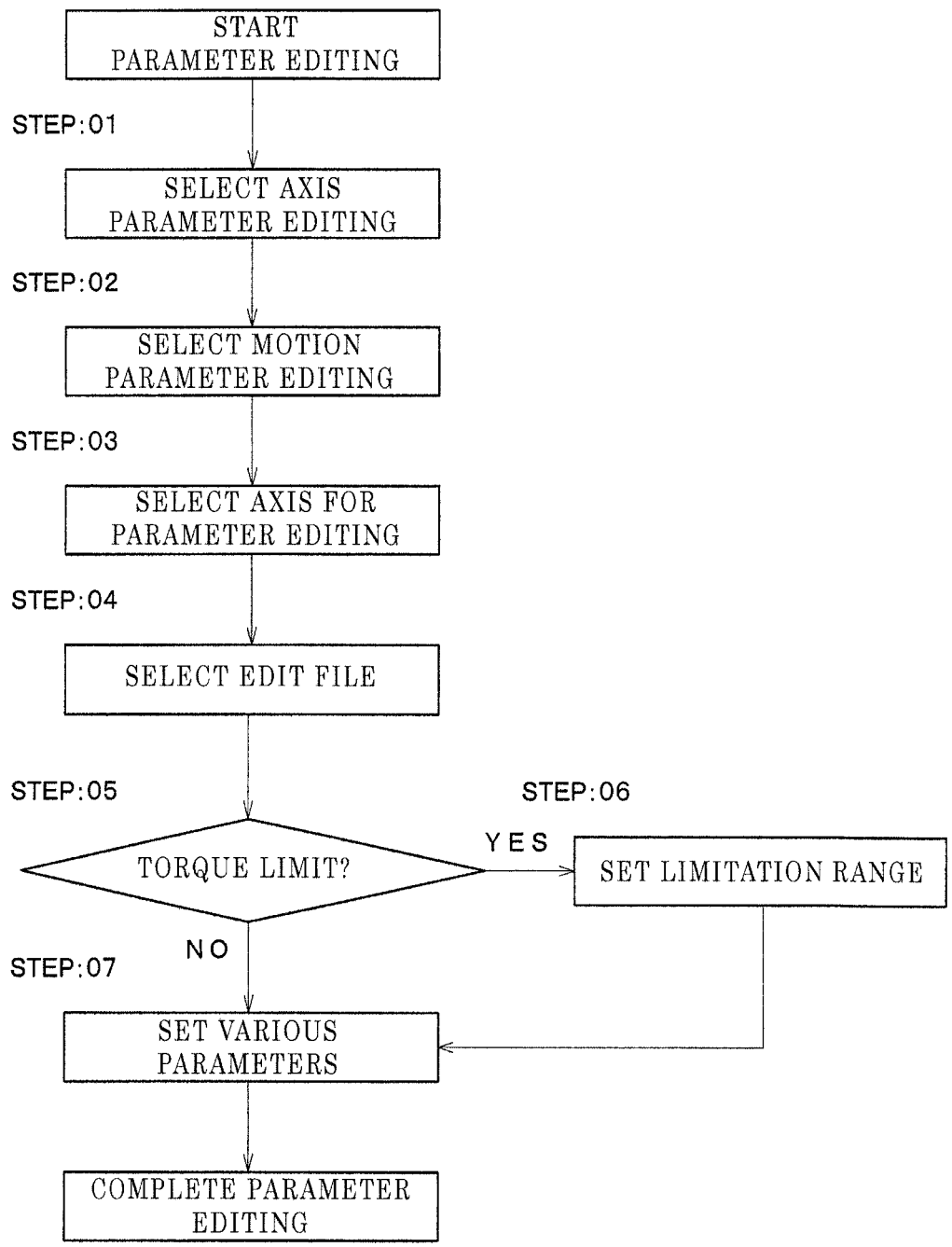
FIG. 5 is a flowchart for explaining a parameter editing method according to the present invention.

Next, with reference to the flowchart of FIG. 5, an explanation will be given on a parameter setting flow through the manipulation unit 80 before a carrying process is performed.

To start editing of parameters of the carrying mechanisms using the manipulation unit 80, the parameter editor program stored in the data storage unit 44 is executed, and a parameter editor screen is displayed on the monitor 73.

In STEP: 01, editing of axis system parameters is selected through the monitor 73 by using the input device 72, and the monitor 73 switches to a parameter editor menu screen.

In STEP: 02, motion parameter editing is selected from the parameter editor menu screen, and the monitor 73 switches to a carrying mechanism selection screen.

In STEP: 03, if motion parameter editing is selected from the parameter editor menu screen, the monitor 73 displays images of three carrying mechanisms (the pod carrying device 15, the wafer carrying mechanism 24, and the boat elevator 32), and along with this, axes of the motion actuators 58, 59, 60, 61, 62, 63, and 64 configured to actuate the carrying mechanisms in predetermined directions are also displayed in the carrying mechanism images. For example, axes such as the CX-axis and the CZ-axis are displayed in the image of the pod carrying device 15, axes such as the X-axis and the Y-axis are displayed in the image of the wafer carrying mechanism 24. The axes of the carrying mechanisms can be selected from the images for editing parameters. In the following description, for example, it is assumed that the X-axis of the wafer carrying mechanism 24 is selected.

In STEP: 04, names of parameter edit files, which are stored in the memory unit 43 for controlling the second motion actuator 61 configured to actuate the wafer carrying mechanism 24 in the X-axis direction, are displayed on the monitor 73, and one of the displayed files is selected for editing the selected file.

In STEP: 05, when the selected file is spread out and displayed on the monitor 73, an item is selected to edit information about the torque control with reference to the X-axis of the second motion actuator 61.

In STEP: 06, after the item for editing torque control is selected, for the second motion actuator 61, one of four options of 0: no function, 1: limit on +direction movement, 2: limit on −direction movement, and 3: limits on ±direction movements is selected, or one of numerals 0 to 3 is input.

In STEP: 07, after one of the four options is selected, parameters (refer to FIG. 8A and FIG. 8B) such as a target position, a carrying mechanism actuating velocity, an acceleration, a deceleration, and a torque limitation value are edited for the second motion actuator 61, and in this way, parameter setting is completed prior to a carrying process.

FIG. 8A and FIG. 8B illustrate screens for setting options such as enabling/disabling of torque control and a detection function of a vibration sensor: in which FIG. 8A illustrates an example of a torque control setting screen 91 for setting items such as a torque control enable/disable item, and FIG. 8B illustrates an example of a torque control value setting screen 92 for setting values such as torque control values. Referring to FIG. 8A and FIG. 8B, separate screens are provided for setting enable/disable of torque control, and setting of torque control values; however, those settings may be carried out by using a single screen.

When setting of torque control is performed, first, a torque control enable/disable item 93 is selected from setting items displayed in the torque control setting screen 91, and one of numerals 0 to 3 is input or selected as a setting value. 0 is selected to disable the torque control function, that is, not to use the torque control function, and one of numerals 1 to 3 is selected to enable the torque control function.

After the torque limit function is set, the torque control value setting screen 92 is displayed, and one of items displayed in the torque control value setting screen 92 corresponding to the setting made in the torque control setting screen 91 is selected. That is, if 1 is selected in the torque control setting screen 91, a forward torque limit value 94 is selected, if 2 is selected, a backward torque limit value 95 is selected, and if 3 is selected, both the forward torque limit value 94 and the backward torque limitation value 95 are selected. Here, the torque limit value items are two so as to set torque limit values in both the forward and backward (±) directions.

The wafer placement plates 25 are movable straightly in the X-axis direction, rotatable in the Y-axis direction, and movable upward and downward in the z-axis direction. In the X-axis direction, a horizontally straight motion of the wafer placement plates 25 is controlled. Hereinafter, X-axis torque limitation will be described.

For example, in a wafer discharging operation, different velocities are set for the case where the wafer placement plates 25 move to wafers 18 held in the boat 26 for picking up the wafers, and the case where the wafer placement plates 25 take wafers 18 out of the boat 26 after holding the wafers 18. Therefore, it is preferable that different torque limitation value be set. In addition, for example, torque limitation may be disabled for the case where the wafer placement plates 25 move without holding wafers 18, and torque limitation may be enabled for the case where the wafer placement plates 25 move in a state where the wafer placement plates 25 hold wafers 18. In this manner, even in the same axis, different torque limitation settings may be made according to the directions of motions.

The above-described settings can be made in same manner for the Y-axis and the Z-axis so as to make detailed settings for the respective axes, and by this, undesired torque errors can be prevented.

Figure 6:
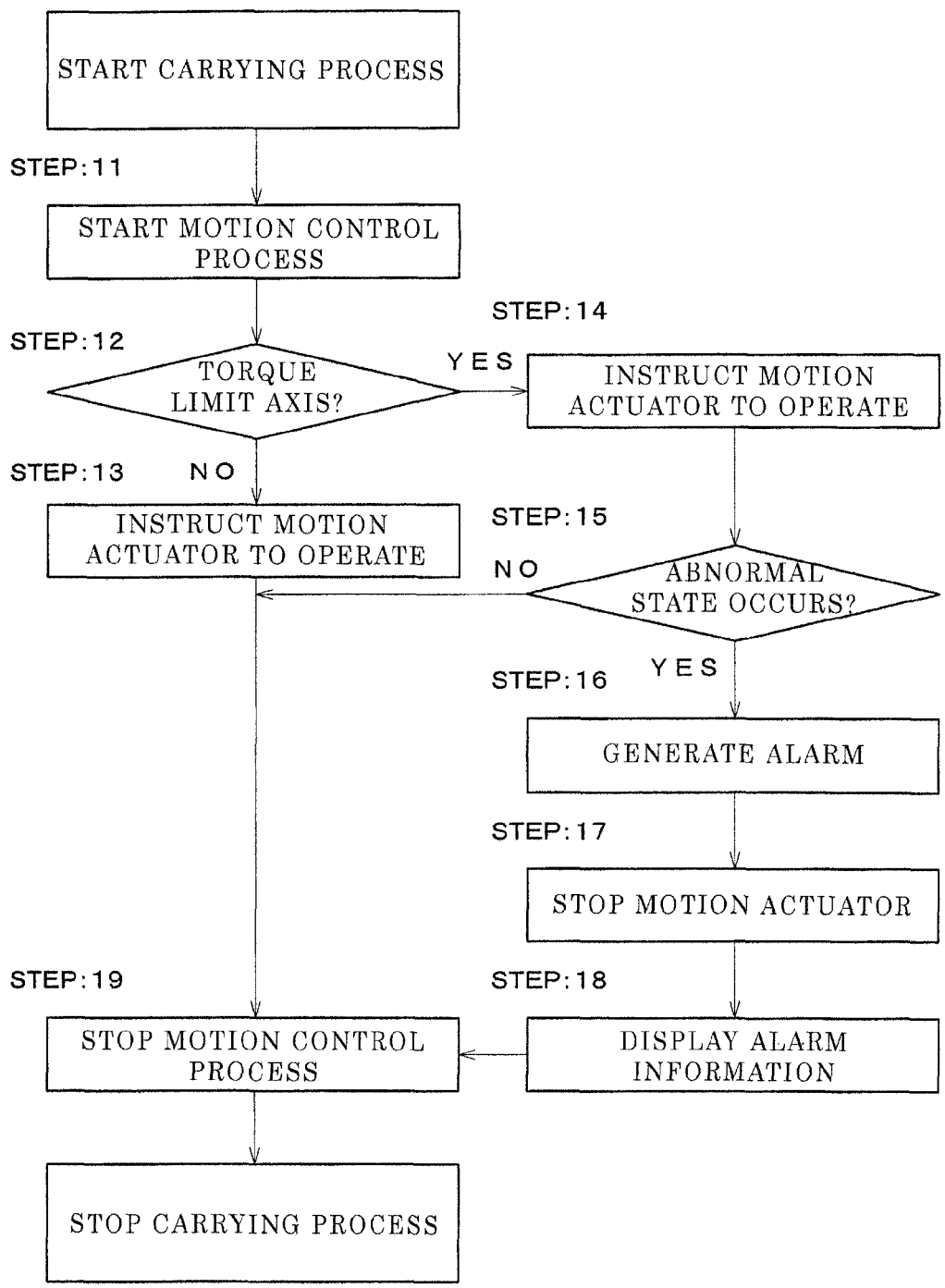
FIG. 6 is a flowchart for explaining a motion control process for selecting enabling or disabling of torque limitation function of each actuator and displaying an alarm information in response to detection of an abnormal state, according to the present invention.

Next, with reference to FIG. 6, an explanation will be given on a flow of a carrying process preformed after setting parameters of the X-axis of the second motion actuator 61.

In STEP: 11, after setting parameters, a carrying process is started as follows: a carrying operation execution instruction is input from the manipulation unit 80 to execute the carrying program stored in the memory unit 43, and according to an instruction output from the carrying program, the motion control program is executed to control the second motion actuator 61 configured to actuate the wafer carrying mechanism 24.

In STEP: 12, according to the motion control program, the second motion control unit 56 determines whether an X-axis torque control is enabled for the second motion actuator 61 configured to actuate the wafer carrying mechanism 24.

In STEP: 13, the second motion control unit 56 instructs the second motion actuator 61 to operate in the X-axis direction. At this time, although a large load is imposed on the second motion actuator 61, the process is continued according to an instruction output from the carrying program output in accordance with set parameters.

In STEP: 14, the second motion control unit 56 outputs an X-axis motion instruction to the second motion actuator 61 for operating the second motion actuator 61 in accordance with torque limitation values set in a parameter setting process.

In STEP: 15, during the process, the state detection sensor 68 continuously monitors eleven items of stop reasons of the second motion actuator 61 to determine whether the second motion actuator 61 behaves abnormally.

In STEP: 16, if the state detection sensor 68 installed at the second motion actuator 61 detects an abnormal state, the state detection sensor 68 generates an alarm signal.

In STEP: 17, the alarm signal output from the state detection sensor 68 is reported to the carrying control unit 39 through second motion control unit 56 that controls the second motion actuator 61, and in response to the received alarm signal, the carrying control unit 39 interrupts a motion control process of the second motion actuator 61 which is detected to be abnormal and stops the wafer carrying mechanism 24. In some cases, as well as the alarm signal output in response to an abnormal state (a detection result of an abnormal state), a detection result temporarily stored in the second motion control unit 56 may be reported as an alarm signal.

In STEP: 18, the alarm signal output from the state detection sensor 68 is reported to the main control unit 41 through the second motion control unit 56 and the carrying control unit 39, and in response to the received alarm signal, the main control unit 41 executes the alarm information display program stored in the data storage unit 44. Then, the alarm information display program displays a stop reason detected by the state detection sensor 68 on the monitor 73 (refer to FIG. 4A to FIG. 4C).

In STEP: 19, in response to the interruption of the motion control process, the carrying control unit 39 interrupts and terminates a carrying process. Furthermore, in the case where the torque control is disabled when setting parameters or the state detection sensor 68 does not detect an abnormal state although the torque control is enabled, the second motion actuator 61 is controlled by the second motion control unit 56 according to an instruction of the carrying program, and the motion control process and the carrying process are terminated.

Furthermore, in STEP: 04 to 07 and STEP: 11 to 19, setting of X-axis parameters of the second motion actuator 61 are explained. However, parameters may be set for other axes or other motion actuators in the same way as that used for setting X-axis parameters of the second motion actuator 61.

As described above, according to the present invention, use of a torque control function is selected for each of the motion actuators 58, 59, 60, 61, 62, 63, and 64 that are used to actuate the carrying mechanisms, such as the pod carrying device 15, the wafer carrying mechanism 24, and the boat elevator 32, in the directions of predetermined axes, so that a motion control process may not be interrupted due to unnecessary torque control.

In addition, if the state detection sensors 65, 66, 67, 68, 69, 70, and 71 detect an abnormal state, a motion control process of the motion actuators 58, 59, 60, 61, 62, 63, and 64 is interrupted, and the carrying mechanisms are stopped. In this case, a detailed stop reason is detected by the state detection sensors 65, 66, 67, 68, 69, 70, and 71 installed at the respective motion actuators 58, 59, 60, 61, 62, 63, and 64, and the detected stop reason is feed back to the main control unit 41, so that a detailed proper alarm information can be displayed on the monitor 73 although the carrying control unit 39 collects date from the motion control units 55, 56, and 57 at a frequency different from the frequency at which the motion control units 55, 56, and 57 receive detection results from the state detection sensors 65, 66, 67, 68, 69, 70, and 71. In addition, memories are installed in the motion control units 55, 56, and 57, respectively, and detection results output from the state detection sensors 65, 66, 67, 68, 69, 70, and 71 of the respective motion actuators 58, 59, 60, 61, 62, 63, and 64 are temporarily stored in the memories, so that a reason of an abnormal state can be inspected more properly by using reported alarm information including the stored detection results.

In addition, since parameter setting is performed using the manipulation unit 80 of the substrate processing apparatus 1, it is unnecessary to carry an adjustment tool into a customer's clean room for adjusting the respective motion actuators 58, 59, 60, 61, 62, 63, and 64, and parameter setting can be performed more easily. Therefore, enabling/disabling of the torque control of the respective motion actuators 58, 59, 60, 61, 62, 63, and 64, and setting and changing of torque limitation values can be performed with much less effort.

Figure 7:
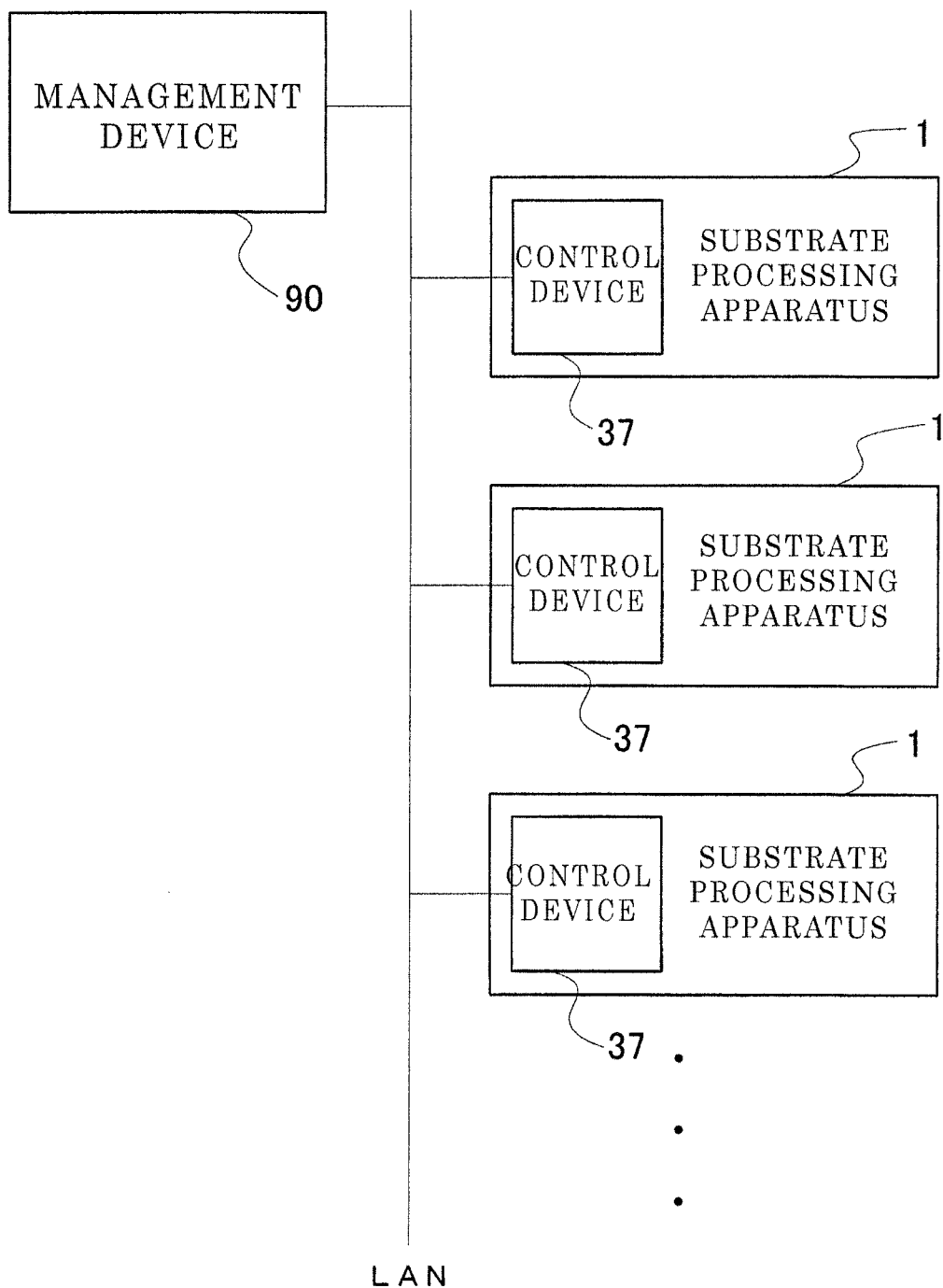
FIG. 7 is a block diagram illustrating a substrate processing system according to the present invention.

In addition, as shown in FIG. 7, the control device 37 of the substrate processing apparatus 1 can be connected to a management device 90 such as a host computer through a communication medium such as a LAN, so as to control the substrate processing apparatus 1 in a remote place. That is, in the current embodiment, setting of the carrying mechanisms is performed using setting screens displayed on the monitor 73 connected to the main control unit 41 of the substrate processing apparatus 1; however, such setting functions may be transferred to the management device 90 according to another embodiment of the present invention.

In addition, examples of film-forming processes, which can be performed using the substrate processing apparatus of the present invention, include a chemical vapor deposition (CVD) process, a physical vapor deposition (PVD) process, an oxide film forming process, a nitride film forming process, and a metal-containing film forming process.

In addition, the substrate processing apparatus of the present invention can be applied to an apparatus for processing a glass substrate of an LCD device or the like as well as a semiconductor manufacturing apparatus. Furthermore, the present invention can be applied to a single-wafer type substrate processing apparatus or a substrate processing apparatus including a horizontal process furnace as well as a vertical type substrate processing apparatus. Moreover, the present invention can be applied to other substrate processing apparatuses such as an exposing apparatus, a lithography apparatus, and a coating apparatus.

As described above, according to the present invention, there is provided a substrate processing apparatus including: a manipulation unit including a manipulation screen configured to display a state of at least one of a substrate carrying mechanism and a substrate processing mechanism; and a control unit including a carrying system controller configured to control the substrate carrying mechanism. The manipulation unit comprises a setting screen through which detection conditions of sensors configured to detect states of the substrate carrying mechanism and the substrate processing mechanism, and information about a torque limitation including the enabling or disabling of the torque control and a torque control value are set for the substrate carrying mechanism. The carrying system controller assigns a motion of the substrate carrying mechanism to a carrying control module based on an instruction received from the manipulation unit, and the carrying control module controls the substrate carrying mechanism according to the instruction from the manipulation unit and the information about the torque limitation. Therefore, when information about torque limitation is set, it is not necessary to locate an adjustment tool at a place where the substrate processing apparatus is installed, and various substrate carrying mechanisms can be easily controlled. In addition, the various substrate carrying mechanisms can be precisely controlled according to settings of torque limitation information.

In addition, according to the present invention, if the substrate carrying mechanism is stopped because a torque equal to or greater than the torque limitation value is applied to the substrate carrying mechanism or a vibration sensor of the sensors detects an abnormal state, the manipulation unit controls the manipulation screen to display information about a stop reason of the substrate carrying mechanism and a detection result of the vibration sensor corresponding to the abnormal state. Therefore, the reason of the abnormal state can be easily examined.

In addition, according to the present invention, the manipulation unit controls the manipulation screen to display information about the stop reason of the substrate carrying mechanism and a temporarily stored detection result which is obtained before the abnormal state occurs. Therefore, a detection result of the sensor obtained before the occurrence of the abnormal state can be compared with a detection result of the sensor obtained after the occurrence of the abnormal state, and thus, the reason of the abnormal state can be examined more easily.

Moreover, according to the present invention, there is provided a method of displaying an abnormal state of a substrate processing apparatus. The method including: detecting an abnormal state by using a sensor configured to detect a state of a substrate carrying mechanism; if an abnormal state occurs, reporting information about a stop reason of the substrate carrying mechanism and a detection result of the sensor to a manipulation unit; and displaying the stop reason contained in the information on a manipulation screen. Therefore, the reason of the abnormal state detected by the sensor can be checked through the manipulation unit without having to inspect the substrate carrying mechanism, and thus the stop reason can be easily checked in a shorter time.

(Supplementary Note)

The present invention also includes the following embodiments.

(Supplementary Note 1)

According to an embodiment of the present invention, there is provided a substrate processing apparatus including: a manipulation unit including a manipulation screen configured to display a state of at least one of a substrate carrying mechanism and a substrate processing mechanism; and a control unit including a carrying system controller configured to control the substrate carrying mechanism, wherein the manipulation unit comprises a setting screen through which detection conditions of sensors configured to detect states of the substrate carrying mechanism and the substrate processing mechanism, and information about a torque limitation including the enabling or disabling of the torque control and a torque control value are set for the substrate carrying mechanism, wherein after setting on the setting screen is completed, the carrying system controller assigns a motion of the substrate carrying mechanism to a carrying control module based on an instruction received from the manipulation unit, and the carrying control module controls the substrate carrying mechanism according to the instruction from the manipulation unit and the information about the torque limitation.

(Supplementary Note 2)

In the substrate processing apparatus of Supplementary Note 1, information about a torque limitation may be set for each axis of the substrate carrying mechanism to be controlled.

(Supplementary Note 3)

In the substrate processing apparatus of Supplementary Note 1, the carrying control module may report detection results of sensors of the substrate carrying mechanism to the carrying system controller.

(Supplementary Note 4)

According to another embodiment of the present invention, there is provided a method of manufacturing a semiconductor device, the method including: editing and executing a file including a predetermined recipe or a parameter by using a manipulation screen; sending a motion instruction to a carrying control module from a carrying system controller connected to a control unit based on the file edited and executed using the manipulation screen; controlling a substrate carrying mechanism by using the carrying control module based on the motion instruction received from the carrying system controller and a previously received setting information; and carrying a substrate by using the controlled substrate carrying mechanism.

(Supplementary Note 5)

According to another embodiment of the present invention, there is provided a substrate processing system including: a substrate processing apparatus; and a management device connected to the substrate processing apparatus for communication with the substrate processing apparatus, wherein the substrate processing apparatus comprises: a manipulation unit including a screen for setting torque limitation information containing at least one of an enabling/disabling of a torque control state and a torque control value, and a manipulation screen for displaying a screen for monitoring a state of a substrate carrying mechanism or a substrate processing mechanism; and a control unit including a carrying system controller configured to control a substrate carrying process according to an instruction input through the manipulation screen, wherein the management device is configured to control the substrate processing apparatus in a remote place through a communication medium.

What is claimed is:

1. A substrate processing apparatus comprising:
   a manipulation unit comprising a manipulation screen configured to display at least a state of a substrate carrying mechanism configured to carry a substrate, and
   a setting screen through which information about a torque limitation including enabling or disabling of torque control and a torque limit value is set for the substrate carrying mechanism; and
   a control unit comprising a carrying system controller configured to assign an operation of the substrate carrying mechanism to a carrying control module based on an instruction received from the manipulation unit,
   wherein the manipulation unit controls the manipulation screen to display a detection result of one or more state detection sensors configured to detect the state of the substrate carrying mechanism when the substrate carrying mechanism is stopped due to an abnormal state occurring while the substrate is carried by the substrate carrying mechanism according to control of the control unit based on the instruction received from the manipulation unit and the information about the torque limitation.

2. The substrate processing apparatus of claim 1, wherein the one or more state detection sensors comprises a plurality of state detection sensors, and
   wherein, when the substrate carrying mechanism is stopped due to a detection of an abnormal state by a vibration sensor of the plurality of state detection sensors or due to a detection of a torque equal to or greater than the torque limit value by one of the plurality of the state detection sensors, the manipulation unit controls the manipulation screen to display information about a stop reason of the substrate carrying mechanism including detection results of the vibration sensor and the one of the plurality of the state detection sensors.

3. The substrate processing apparatus of claim 2, wherein the manipulation unit controls the manipulation screen to display the information about the stop reason including a temporarily stored detection result obtained before the abnormal state occurs.

4. A method of displaying an abnormal state of a substrate processing apparatus according to claim 1, the method comprising:
   detecting an abnormal state by using state detection sensors configured to detect a state of a substrate carrying mechanism;

reporting information about a stop reason of the substrate carrying mechanism including a detection result of the state detection sensors to a manipulation unit when an abnormal state occurs; and controlling a manipulation screen to display a signal representing the stop reason included in the information about the stop reason.

5. The substrate processing apparatus of one of claims 1 through 3, wherein a signal representing the detection result of the state detection sensors includes at least one of a torque limit operation signal and a vibration sensor signal.

6. The substrate processing apparatus of claim 1, wherein the information about the torque limitation is settable through the setting screen for each axis of the substrate carrying mechanism.

7. A method of displaying an abnormal state of a substrate processing apparatus comprising a manipulation unit including a manipulation screen configured to display at least a state of a substrate carrying mechanism configured to carry a substrate and a substrate processing mechanism configured to process the substrate and a setting screen through which information about a torque limitation including enabling or disabling of torque control and a torque limit value is set for the substrate carrying mechanism, the method comprising:

carrying the substrate by controlling the substrate carrying mechanism based on an instruction received from the manipulation unit and the information about the torque limitation;

detecting an abnormal state by state detection sensors configured to detect a state of the substrate carrying mechanism;

reporting to the manipulation unit information about a stop reason of the substrate carrying mechanism including a detection result of the state detection sensors; and controlling the manipulation screen to display a signal representing the stop reason included in the information about the stop reason reported to the manipulation unit and a detection result reported by one of the state detection sensors having detected a torque equal to or greater than the torque limit value applied to the substrate carrying mechanism.

8. A substrate processing apparatus comprising:

a manipulation unit including a manipulation screen configured to display at least a state of a substrate carrying mechanism configured to carry a substrate and a setting screen through which torque control is enabled or disabled for the substrate carrying mechanism, wherein the manipulation unit executes a program comprising:

a sequence of detecting an abnormal state by state detection sensors configured to detect the state of the substrate carrying mechanism;

a sequence of reporting to the manipulation unit information about a stop reason of the substrate carrying mechanism including a detection result of the state detection sensors; and a sequence of controlling the manipulation screen to display a signal representing a stop reason included in the information about the stop reason reported to the manipulation unit, the signal representing a detection result reported by a vibration sensor of the state detection sensors having detected an abnormal state or by one of the state detection sensors having detected a torque equal to or greater than a torque limit value applied to the substrate carrying mechanism.

9. A non-transitory computer-readable recording medium storing a program to be executed by a manipulation unit comprising a manipulation screen configured to display at least a state of a substrate carrying mechanism configured to carry a substrate, the program comprising:

a sequence of setting torque control to be enabled or disabled for the substrate carrying mechanism;

a sequence of detecting an abnormal state by state detection sensors configured to detect the state of the substrate carrying mechanism;

a sequence of reporting information about a stop reason of the substrate carrying mechanism including a detection result of the state detection sensors to the manipulation unit; and a sequence of controlling the manipulation screen to display a signal representing the stop reason included in the information about the stop reason reported to the manipulation unit, and a detection result reported by a vibration sensor of the state detection sensors having detected an abnormal state or by one of the state detection sensors having detected a torque equal to or greater than a torque limit value applied to the substrate carrying mechanism.

* * * * *